(12) United States Patent
Ishida et al.

(10) Patent No.: US 6,269,033 B1
(45) Date of Patent: *Jul. 31, 2001

(54) SEMICONDUCTOR MEMORY DEVICE HAVING REDUNDANCY UNIT FOR DATA LINE COMPENSATION

(75) Inventors: Yoshiyuki Ishida; Yasushige Ogawa, both of Kasugai (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/480,619

(22) Filed: Jan. 10, 2000

(30) Foreign Application Priority Data

Jul. 16, 1999 (JP) .................................................. 11-203767

(51) Int. Cl.[7] ....................................................... G11C 7/02
(52) U.S. Cl. ............................................ 365/200; 365/210
(58) Field of Search .................................. 365/200, 207, 365/210, 189.07, 189.09

(56) References Cited

U.S. PATENT DOCUMENTS 5,148,397 * 9/1992 Kokubun .............................. 365/200

* cited by examiner

Primary Examiner—Terrell W. Fears
(74) Attorney, Agent, or Firm—Arent Fox Kintner Plotkin & Kahn, PLLC

(57) ABSTRACT

A semiconductor memory device, such as a SDRAM, includes input/output data line pairs, data bus line pairs, and a redundancy data bus line pair. The input/output data line pairs are connected to a corresponding one of the data bus line pairs and an adjacent one of the data bus line pairs via redundancy shift switches, with a last one of the input/output data line pairs being connected to a last one fo the data bus line pairs and the redundancy data bus line pair. Sense buffers and write amplifiers are connected between each of the data bus line pairs and the redundancy data line pair. The shift switches are located closer to the input/output data line pairs than the sense buffers and the write amplifiers so that data read from the memory cells is less effected by the on resistance and the parasitic capacitance of the switches. When the switches are located closer to the data bus lines than the sense buffers and the write amplifiers are, the switches effect the data signals of data read from the memory cells.

13 Claims, 7 Drawing Sheets

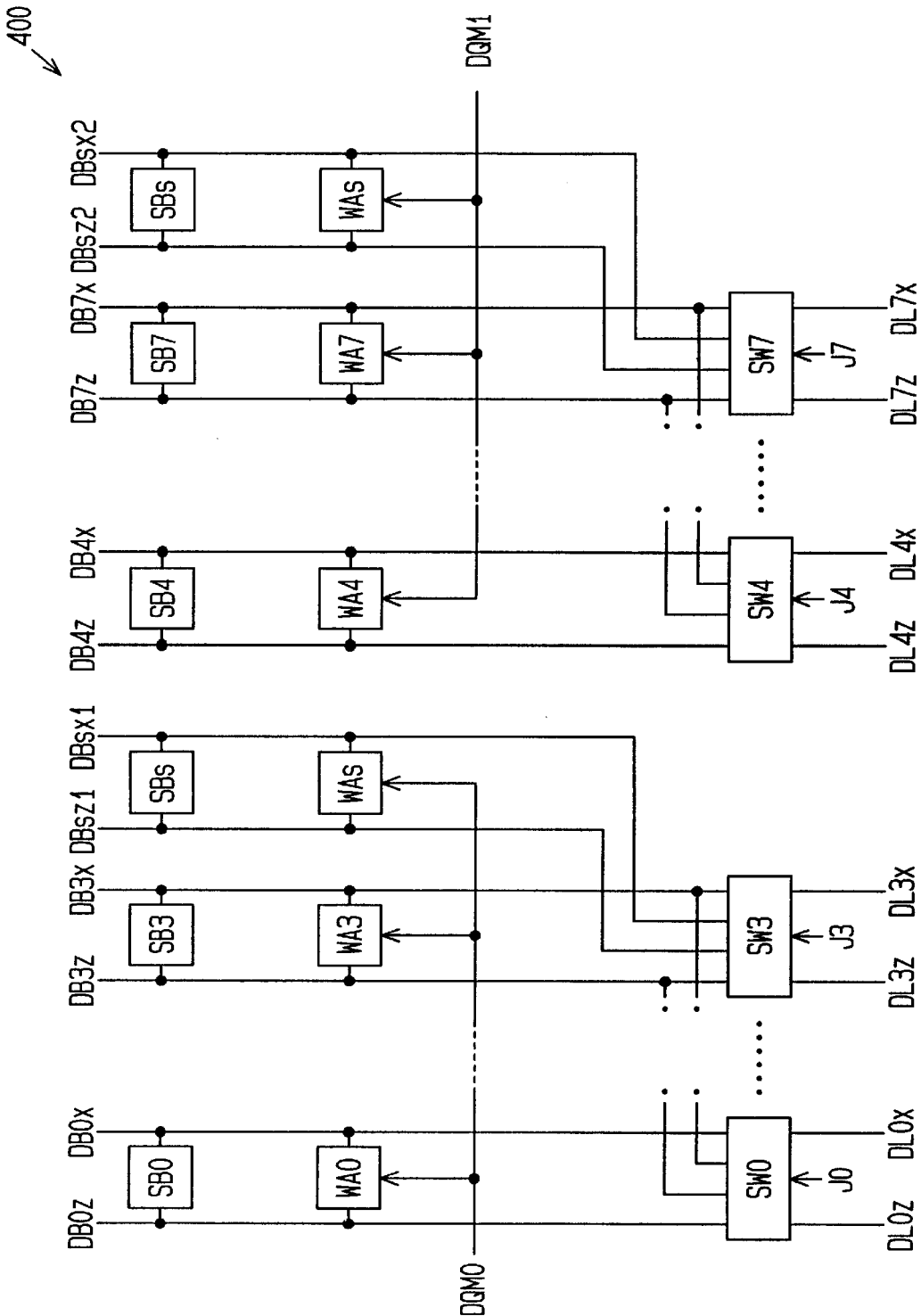

SEMICONDUCTOR MEMORY DEVICE HAVING REDUNDANCY UNIT FOR DATA LINE COMPENSATION

BACKGROUND OF THE INVENTION

The present invention relates to semiconductor memory devices and, more particularly, to a semiconductor memory device having a redundancy unit for data line compensation.

Generally, conventional semiconductor memory devices, such as a synchronous dynamic random access memory (SDRAM), include a redundancy unit that uses a shift redundancy system. FIG. 1 is a circuit diagram of a conventional redundancy unit 100 that uses a shift redundancy system.

As shown in FIG. 1, the redundancy unit 100 comprises sixteen data bus lines DB0 to DB15, and a single redundancy data bus line DBs provided for the data bus lines DB0 to DB15. The first to sixteenth data bus lines DB0 to DB15 are connected to first to sixteenth input/output data lines DL0 to DL15 through related first to sixteenth shift switches SW0 to SW15, respectively. Sense buffers SB0 to SB15 and write amplifiers WA0 to WA15 are connected between the first to sixteenth shift switches SW0 to SW15 and the first to sixteenth input/output data lines DL0 to DL15, respectively.

The first to fifteenth shift switches SW0 to SW14 switch the connection of the first to fifteenth input/output data lines DL0 to DL14 between the first to fifteenth data bus lines DB0 to DB14 and the second to sixteenth data bus lines DB1 to DB15, each of which is one bit higher than each of the first to fifteenth data bus lines DB0 to DB14. The sixteenth shift switch SW15 switches the connection of the sixteenth input/output data line DL15 between the sixteenth data bus line DB15 and the redundancy data bus line DBs.

For example, when a defect occurs at the fourteenth data bus line DB13, the shift redundancy operation is performed using the shift switches SW13, SW14 and SW15. More specifically, the connection of the fourteenth input/output data line DL13 is switched to the fifteenth data bus line DB14, the connection of the fifteenth input/output data line DL14 is switched to the sixteenth data bus line DB15, and the connection of the sixteenth input/output data line DL15 is switched to the redundancy data bus line DBs.

That is, in the shift redundancy system, the connection of both of a defective one and the rest of the data bus lines DB0 to DB15 is switched, using the related shift switches SW0 to SW15, to the normal upper rank data bus lines DB0 to DB15 and to the redundancy data bus line DBs, sequentially. As a result, a semiconductor memory device that functions normally is implemented.

By the way, in the conventional shift redundancy system, the shift switches SW0 to SW15 are closer to bit lines BL than the sense buffers SB0 to SB15 and the write amplifiers WA0 to WA15, respectively.

During a read operation, data read from memory cells (not shown) has a very small amplitude until it reaches the sense buffers SB0 to SB15 via sense amplifiers SA. When the sense buffers SB0 to SB15 amplify the data whose amplitude is very small, the ON resistance and parasitic capacitance of the shift switches SW0 to SW15 are added to the load on the data bus lines DB0 to DB15 and DBs, and thus the bus logic of the sense buffers SB0 to SB15 is hard to invert. The same problem is encountered by the write amplifiers WA0 to WA15 during a write operation.

In order to make the logic inversion easier, there is a technique in which the size of the shift switches SW0 to SW15 is increased so that the effects of the ON resistance and parasitic capacitance of the shift switches SW0 to SW15 is reduced. However, larger shift switches SW0 to SW15 bring about another problem in that the circuit area is increased and thus it becomes difficult to lay out the switches SW0 to SW15 within a pitch of the data bus. Further, another problem is that the power consumption of the semiconductor memory device increases.

SUMMARY OF THE INVENTION

An object of the present invention is to provide a semiconductor memory device having a redundancy unit that uses the shift redundancy system and generates correct data with high accuracy.

In one aspect of the present invention, a semiconductor memory device including a plurality of input/output data line pairs, a plurality of data bus line pairs corresponding to the plurality of input/output data line pairs, and a redundancy data bus line pair adjacent to one of the plurality of data bus line pairs is provided. Each of a plurality of sense buffers is connected between a corresponding one of the data bus line pairs and between the redundancy data bus line pair. Each of plurality of write amplifiers is connected between a corresponding one of the data bus line pairs and between the redundancy data bus line pair. Each of a plurality of redundancy shift switches selectively connects a corresponding one of the input/output data line pairs to a corresponding one of the data bus line pairs and to one data bus line pair, including the redundancy data bus line pair, adjacent to the corresponding data bus line pair. The plurality of redundancy shift switches are arranged closer to the plurality of input/output data line pairs than the plurality of the sense buffers and the write amplifiers.

In another aspect of the present invention, a semiconductor memory device including a plurality of input/output data line pair groups, including first and second input/output data line pair groups, a plurality of data bus line groups, including first and second data bus line pair groups corresponding to the first and second input/output data line pair groups, respectively, and a redundancy data bus line pair adjacent to one of the plurality of data bus line groups is provided. A plurality of sense buffer groups includes first and second sense buffer groups corresponding to the first and second data bus line pair groups, respectively. Each of the first and second sense buffer groups includes a plurality of sense buffers, each being connected between a corresponding one of the data bus line pairs. A redundancy sense buffer is connected between the redundancy data bus line pair. A plurality of write amplifier groups includes first and second write amplifier groups corresponding to the first and second data bus line pair groups, respectively. Each of the first and second write amplifier groups includes a plurality of write amplifiers, each being connected between a corresponding one of the data bus line pairs, for receiving a mask signal. A redundancy write amplifier is connected between the redundancy data bus line pair. A plurality of redundancy shift switch groups includes first and second redundancy shift switch groups which connect the first and second input/output data line pair groups to the first and second data bus line pair groups and the redundancy data bus line pair. The first and second redundancy shift switch groups are provided closer to the input/output data line pairs than the sense buffers and the write amplifiers. Each of the first and second redundancy shift switch groups includes a plurality of redundancy shift switches, each being connected to a corresponding one of the data bus line pairs and one data bus line pair, including the redundancy data bus line pair, adjacent to the corresponding data bus line pair. A mask signal switching circuit receives a mask signal and provides a switching signal to at least one of the write amplifier and the sense buffer corresponding to one data bus line pair of the second data bus line pair group which is connected to one redundancy shift switch of the first redundancy shift switch group.

In yet another aspect of the present invention, a semiconductor memory device including a plurality of mask groups including first and second mask groups. Each of the first and second mask groups includes a plurality of input/output data line pairs, a plurality of data bus line pairs corresponding to the plurality of input/output data line pairs, amd a redundancy data bus line pair adjacent to one of the plurality of data bus line pairs. Each of a plurality of sense buffers is connected between a corresponding one of the data bus line pairs and between the redundancy data bus line pair. Each of a plurality of write amplifiers is connected between a corresponding one of the data bus line pairs and between the redundancy data bus line pair, for receiving a mask signal. Each of a plurality of redundancy shift switches connects a corresponding one of the input/output data line pairs to a corresponding one of the data bus line pairs and to one data bus line pair or the redundancy data bus line pair, including the redundancy data bus line pair, adjacent to the corresponding data bus line pair. The plurality of redundancy shift switches is arranged closer to the plurality of input/output data line pairs than the plurality of sense buffers and write amplifiers.

Other aspects and advantages of the invention will become apparent from the following description, taken in conjunction with the accompanying drawings, illustrating by way of example the principles of the invention.

BRIEF DESCRIPTION OF THE DRAWINGS

The invention together, with objects and advantages thereof, may best be understood by reference to the following description of the presently preferred embodiments together with the accompanying drawings in which:

FIG. 7 is a block diagram showing the main portion of an SDRAM according to a third embodiment of the present invention.

DETAILED DESCRIPTION OF THE PREFERRED EMBODIMENTS

An SDRAM 200 according to a first embodiment of the present invention will hereinafter be described with reference to FIGS. 2 to 4.

Figure 1:
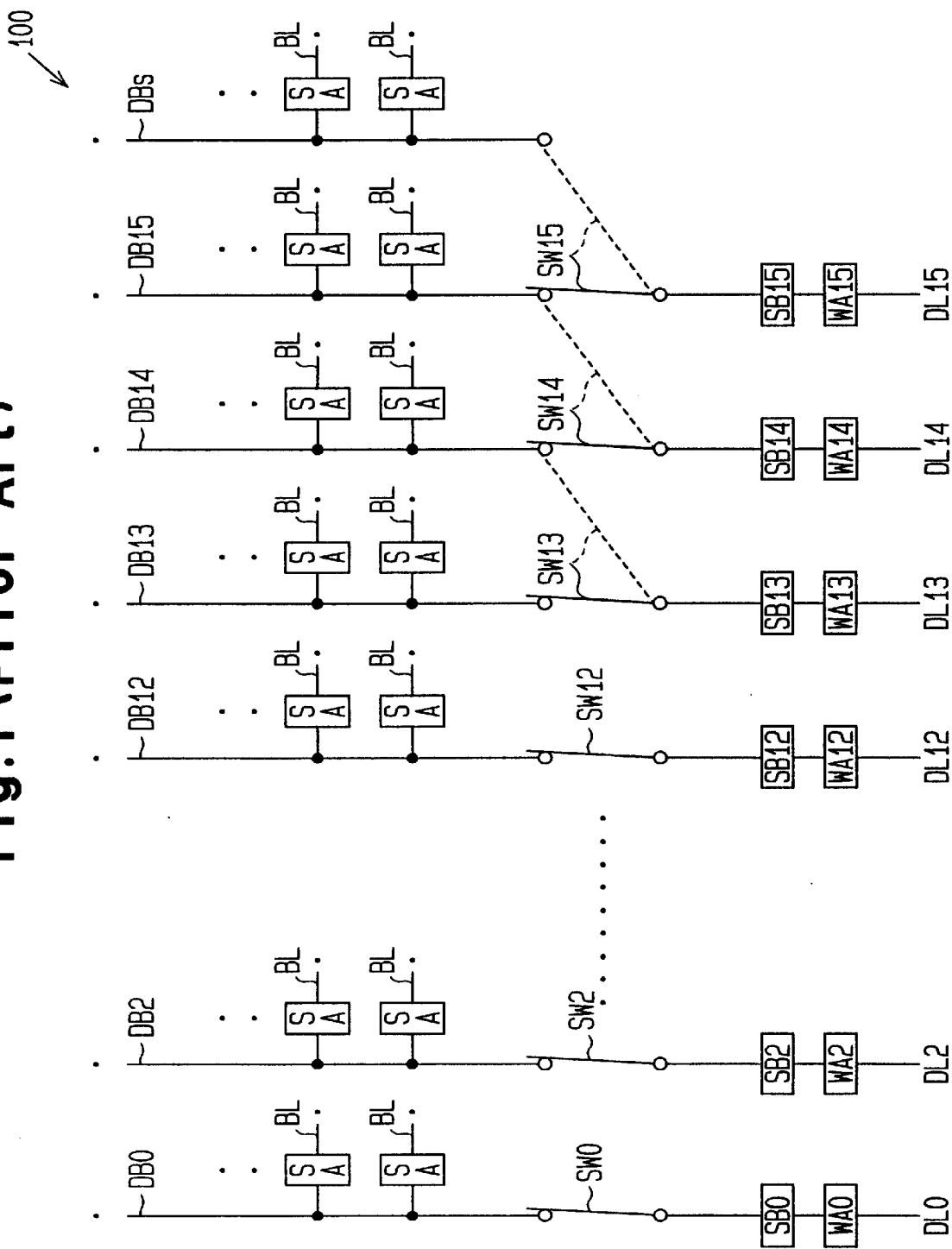
FIG. 1 is a circuit diagram showing the main portion of a redundancy unit of a conventional SDRAM.
Figure 2:
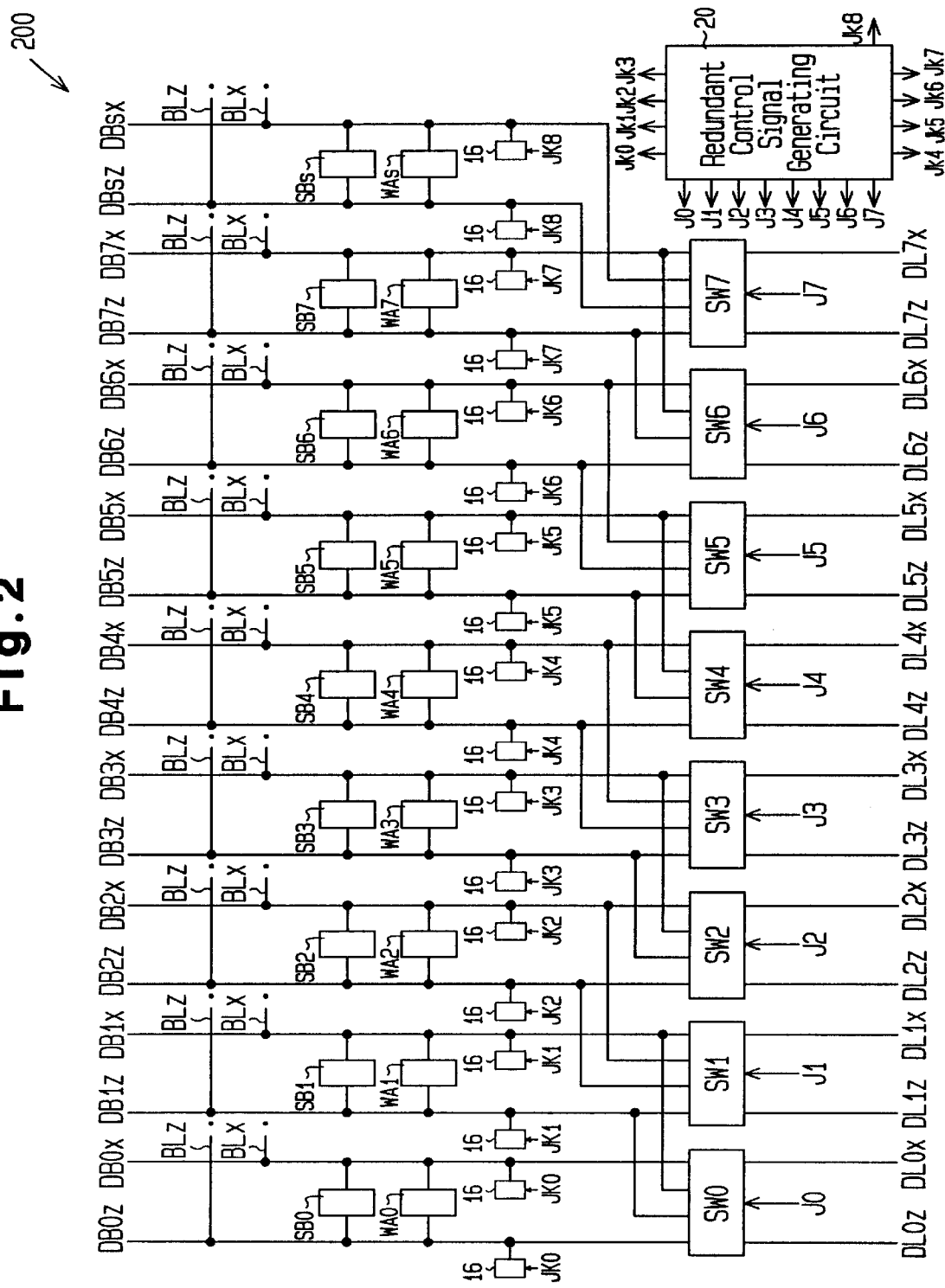
FIG. 2 is a schematic block diagram showing the main portion of a redundancy unit of an SDRAM according to a first embodiment of the present invention.

As shown in FIG. 2, the SDRAM 200 comprises first to eighth data bus line pairs DB0z, DB0x to DB7z, DB7x, and a redundancy data bus line pair DBsz, DBsx. A plurality of bit line pairs BLz, BLx are connected to the data bus line pairs DB0z, DB0x to DB7z, DB7x and DBsz, DBsx, respectively. Each bit line pair BLz, BLx is connected to a memory cell (not shown) through a sense amplifier (not shown). Data read from the memory cells to the bit line pairs BLz, BLx is amplified by sense amplifiers (not shown), and applied to the data bus line pairs DB0z, DB0x to DB7z, DB7x.

Sense buffers SB0 to SB7 and write amplifiers WA0 to WA7 are connected to the data bus line pairs DB0z, DB0x to DB7z, DB7x, respectively, such that, e.g., the buffer SB0 and the amplifier WA0 are connected between the data bus line pair DB0z, DB0x. Further, a sense buffer SBs and a write amplifier WAs are connected between the redundancy data bus line pair DBsz, DBsx.

First to eighth input/output data line pairs DL0z, DL0x to DL7z, DL7x are connected to the data bus line pairs DB0z, DB0x to DB7z, DB7x through first to eighth shift switches SW0 to SW7, respectively.

The first to seventh shift switches SW0 to SW6 excluding the eighth shift switch SW7 are connected such that the connection of the first to seventh input/output data line pairs DL0z, DL0x to DL6z, DL6x is switched between the first to seventh data bus line pairs DB0z, DB0x to DB6z, DB6x and the second to eighth data bus line pairs DB1z, DB1x to DB7z, DB7x, each of which is one bit higher than each of the data bus line pairs DB0z, DB0x to DB6z, DB6x, respectively. The eighth shift switch SW7 is connected such that the connection of the eighth input/output data line pair DL7z, DL7x is switched between the eighth data bus line pair DB7z, DB7x and the redundancy data bus line pair DBsz, DBsx. The first to eighth shift switches SW0 to SW7 receive switching signals J0 to J7, respectively.

Next, the first to eighth shift switches SW0 to SW7 will be described. Since the first to eighth shift switches SW0 to SW7 have substantially the same circuit configuration, the circuit configuration of only the first shift switch SW0 will be described.

Figure 3:
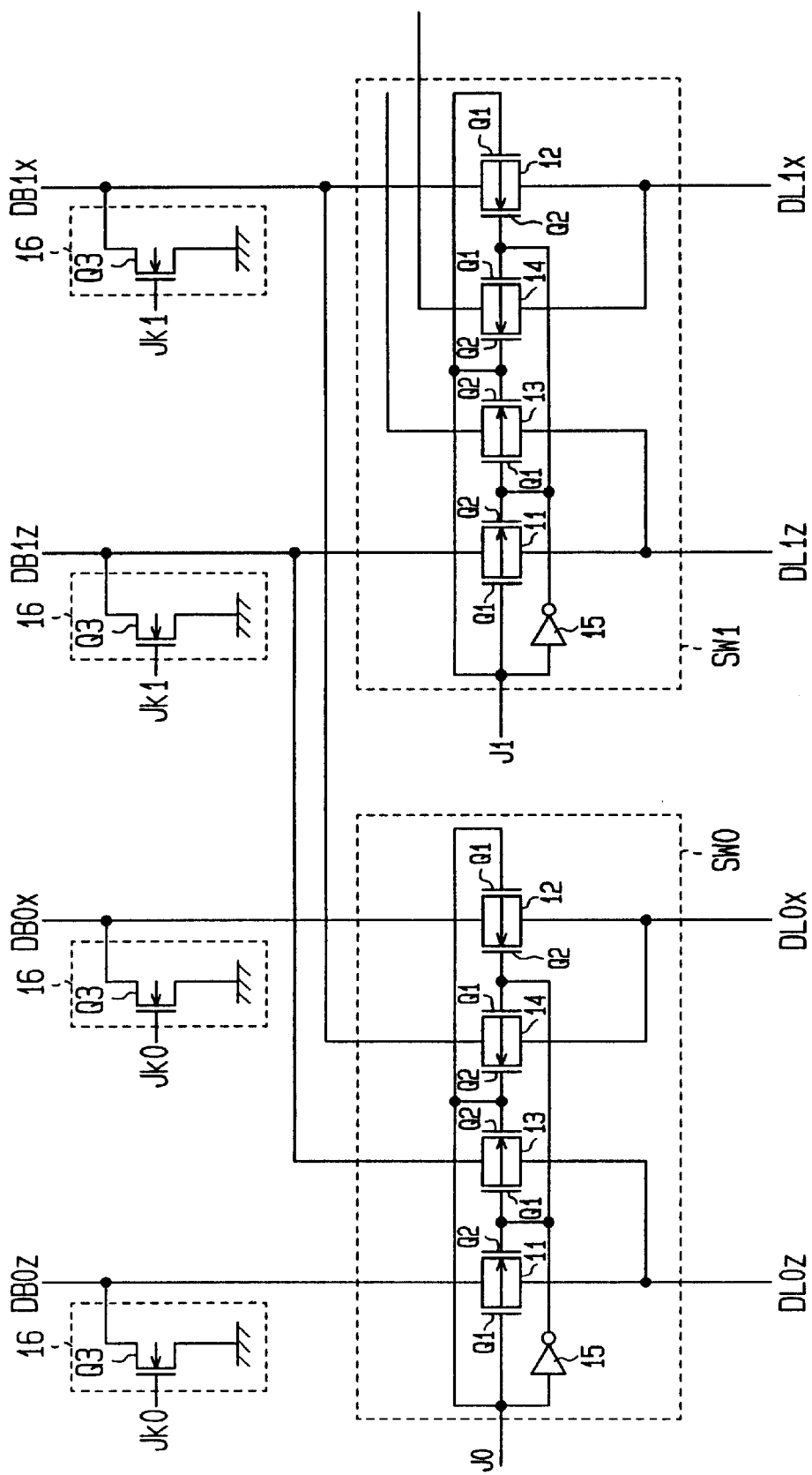
FIG. 3 is a circuit diagram showing shift switches of the redundancy unit of FIG. 2.

As shown in FIG. 3, the first shift switch SW0 includes first to fourth transfer gates 11 to 14 and an inverter circuit 15. Each of the transfer gates 11 to 14 includes a P-channel MOS (PMOS) transistor Q1 and an N-channel MOS (NMOS) transistor Q2.

The first transfer gate 11 is connected between the first input/output data line DL0z and the first data bus line DB0z, and selectively makes or breaks the connection between the first input/output data line DL0z and the first data bus line DB0z. The second transfer gate 12 is connected between the first input/output data line DL0x and the first data bus line DB0x, and selectively makes or breaks the connection between the first input/output data line DL0x and the first data bus line DB0x.

The third transfer gate 13 is connected between the first input/output data line DL0z and the second data bus line DB1z, and selectively makes or breaks the connection between the first input/output data line DL0z and the second data bus line DB1z. The fourth transfer gate 14 is connected between the first input/output data line DL0x and the second data bus line DB1x, and selectively makes or breaks the connection between the first input/output data line DL0x and the second data bus line DB1x.

The first switching signal J0 is applied to the gate of the PMOS transistor Q1 of each of the first and second transfer gates 11 and 12 and to the gate of the NMOS transistor Q2 of each of the third and fourth transfer gates 13 and 14.

The first switching signal J0 is inverted by the inverter circuit 15 and then applied to the gate of the NMOS transistor Q2 of each of the first and second transfer gates 11 and 12 and to the gate of the PMOS transistor Q1 of each of the third and fourth transfer gates 13 and 14.

When the first switching signal J0 is low (low-potential voltage), the first and second transfer gates 11 and 12 are turned on and the third and fourth transfer gates 13 and 14 are turned off. Therefore, the first input/output data line pair DL0z, DL0x is connected to the first data bus line pair DB0z, DB0x, and is disconnected from the second data bus line pair DB1z, DB1x. Further, when the first switching signal J0 is high (high-potential voltage), the first and second transfer gates 11 and 12 are turned off and the third and fourth transfer gates 13 and 14 are turned on. Therefore, the first input/output data line pair DL0z, DL0x is connected to the second data bus line pair DB1z, DB1x, and is disconnected from the first data bus line pair DB0z, DB0x.

That is, the first shift switch SW0 switches the connection of the first input/output data line pair DL0z, DL0x between the first data bus line pair DB0z, DB0x and the second data bus line pair DB1z, DB1x in accordance with the first switching signal J0. The second to eighth shift switches SW1 to SW7 switch the connection between the data bus line pairs DB1z, DB1x to DB7z, DB7x and DBsz, Dbsx and the second to eighth input/output data line pairs DL1z, DL1x to DL7z, DL7x in accordance with the second to eighth switching signals J1 to J7, respectively.

Returning to FIG. 2, clamp circuits 16 are connected to each of the first to eighth data bus line pairs DB0z, DB0x to DB7z, DB7x between the write amplifiers WA0 to WA7 and WAs and the first to eighth shift switches SW0 to SW7, respectively. That is, there is one clamp circuit 16 for each data bus line.

As shown in FIG. 3, each clamp circuit 16 includes an NMOS transistor Q3. The NMOS transistor Q3 has a drain that is connected to a corresponding line of the data bus line pairs DB0z, DB0x to DB7z, DB7x and DBsz, DBsx, a source connected to ground, and a gate that receives a corresponding one of first to ninth clamp control signals JK0 to JK8. The NMOS transistor Q3 of each clamp circuit 16 is turned on when a corresponding clamp control signal is high, so that the corresponding data bus line is grounded.

Figure 4:
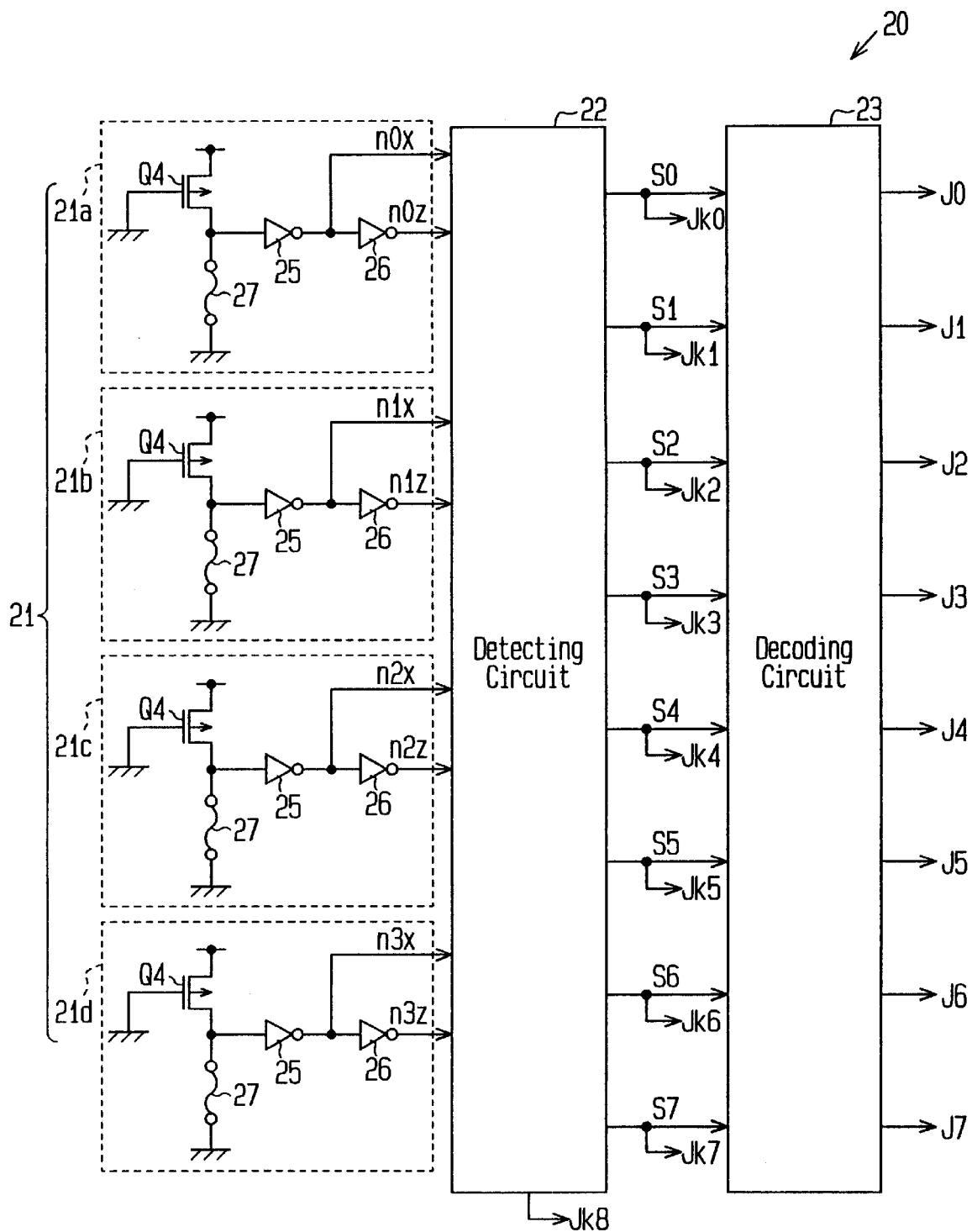
FIG. 4 is a circuit diagram showing a redundant control signal generating circuit of the redundancy unit of FIG. 2.

FIG. 4 is schematic block diagram of a redundant control signal generating circuit 20 which generates the first to ninth clamp control signals JK0 to JK8 and the first to eighth switching signals J0 to J7. The redundant control signal generating circuit 20 includes a fuse circuit 21, a detecting circuit 22, and a decoding circuit 23.

The fuse circuit 21 includes first to fourth fuse circuits 21a to 21d. Each of the first to fourth fuse circuits 21a to 21d includes a PMOS transistor Q4, two series connected inverter circuits 25 and 26, and a fuse 27. The PMOS transistor Q4 has a drain connected to a high voltage power supply line, a source connected to ground through the fuse 27, and a gate connected to a ground. The fuse 27 is cut by a laser based on a test result.

When the fuse 27 is cut, the potential at the drain of the PMOS transistor Q4 is set to a high level. Further, when the fuse 27 is not cut, the potential at the drain of the PMOS transistor Q4 is set to a low level.

The source of each PMOS transistor Q4 is also connected to the input of the inverter circuit 25. The output signals of the inverter circuits 26 are provided to the detecting circuit 22 as first to fourth cut signals n0z to n3z, respectively. Further, the output signals of the inverter circuits 25 are provided to the detecting circuit 22 as first to fourth inverted cut signals n0x to n3x. That is, when the fuses 27 are cut, the first to fourth cut signals n0z to n3z are set to a high level, and the first to fourth inverted cut signals n0x to n3x are set to a low level, respectively. On the other hand, when the fuses 27 are not cut, the first to fourth cut signals n0z to n3z are set to the low level, and the first to fourth inverted cut signals n0x to n3x are set to the high level, respectively.

When none of the first to eighth data bus line pairs DB0z, DB0x to DB7z, DB7x is defective and thus the redundancy data bus line pair DBsz, DBsx need not be used, the fuses 27 of the first to fourth fuse circuits 21a to 21d are not cut. That is, all of the first to fourth cut signals n0z to n3z are set to the low level, and all of the first to fourth inverting cut signals n0x to n3x are set to the high level.

On the other hand, when a defect occurs at any of the first to eighth data bus line pairs DB0z, DB0x to DB7z, DB7x and thus the redundancy data bus line pair DBsz, DBsx is used in place of the defective data bus line pair, the fuse 27 of the fourth fuse circuit 21d is cut. The fuses 27 of the first to third fuse circuits 21a to 21c are selectively cut in accordance with the defective one of the data bus line pairs DB0z, DB0x to DB7z, DB7x.

More specifically, when the first data bus line pair DB0z, DB0x is defective, the fuse 27 of the fourth fuse circuit 21d is cut. When the second data bus line pair DB1z, DB1x is defective, the fuses 27 of the first and fourth fuse circuits 21a and 21d are cut. When the third data bus line pair DB2z, DB2x is defective, the fuses 27 of the second and fourth fuse circuits 21b and 21d are cut. When the fourth data bus line pair DB3z, DB3x is defective, the fuses 27 of the third and fourth fuse circuits 21c and 21d are cut. When the fifth data bus line pair DB4z, DB4x is defective, the fuses 27 of the first, second and fourth fuse circuits 21a, 21b and 21d are cut. When the sixth data bus line pair DB5z, DB5x is defective, the fuses 27 of the first, third and fourth fuse circuits 21a, 21c and 21d are cut. When the seventh data bus line pair DB6z, DB6x is defective, the fuses 27 of the second, third and fourth fuse circuits 21b, 21c and 21d are cut. Finally, when the eighth data bus line pair DB7z, DB7x is defective, the fuses 27 of the first to fourth fuse circuits 21a to 21d are cut. Of course, the fuses 27 of the fuse circuits 21a–21d could be cut in different orders to correspond to the data bus line pairs.

In accordance with whether the fuses 27 are cut, the first to fourth cut signals n0z to n3z and the first to fourth inverting cut signals n0x to n3x are provided to the detecting circuit 22 from the first to fourth fuse circuits 21a to 21d.

The detecting circuit 22 receives the first to fourth cut signals n0z to n3z and the first to fourth inverting cut signals n0x to n3x, generates first to eighth detection signals S0 to S7, and provides the generated detection signals S0 to S7 to the decoding circuit 23. The first to eighth detection signals S0 to S7 indicate the defective one of the data bus line pairs DB0z, DB0x to DB7z, Db7x in accordance with whether the fuses 27 of the first to fourth fuse circuits 21a to 21d are cut.

When the first data bus line pair DB0z, DB0x is defective, the detecting circuit 22 generates the first detection signal S0 high, and second to eighth detection signals S1 to S7 low. When the second data bus line pair DB1z, DB1x is defective, the detecting circuit 22 generates the second detection signal S1 high, and first and third to eighth detection signals S0 and S2 to S7 low. When the third data bus line pair DB2z, DB2x is defective, the detecting circuit 22 generates the third detection signal S2 high, and first, second and fourth to eighth detection signals S0, S1 and S3 to S7 low. When the fourth data bus line pair DB3z, DB3x is defective, the detecting circuit 22 generates the fourth detection signal S3 high, and first to third and fifth to eighth detection signals S0 to S2 and S4 to S7 low. When the fifth data bus line pair DB4z, DB4x is defective, the detecting circuit 22 generates the fifth detection signal S4 high, and first to fourth and sixth to eighth detection signals S0 to S3 and S5 to S7 low. When the sixth data bus line pair DB5z, DB5x is defective, the detecting circuit 22 generates the sixth detection signal S5 high, and first to fifth and seventh and eighth detection signals S0 to S4 and S6 and S7 low. When the seventh data bus line pair DB6z, DB6x is defective, the detecting circuit 22 generates the seventh detection signal S6 high, and first to sixth and eighth detection signals S0 to S5 and S7 low. When the eighth data bus line pair DB7z, DB7x is defective, the detecting circuit 22 generates the eighth detection signal S7 high, and first to seventh detection signals S0 to S6 low. Further, when none of the first to eighth data bus line pairs DB0z, DB0x to DB7z, DB7x is defective and thus the redundancy data bus line pair DBsz, DBsx is not used, the first to eighth detection signals S0 to S7 are low.

The decoding circuit 23 generates the first to eighth switching signals J0 to J7 in accordance with the first to eighth detection signal S0 to S7 from the detecting circuit 22. That is, the decoding circuit 23 generates the first to eighth switching signals J0 to J7 for switching the shift switches SW0 to SW7 in accordance with whether the fuses 27 of the first to fourth fuse circuits 21a to 21d are cut.

More specifically, when none of the first to eighth data bus line pairs DB0z, DB0x to DB7z, DB7x is defective and thus all of the first to eighth detection signals S0 to S7 are low, the decoding circuit 23 outputs first to eighth switching signals J0 to J7 low. Therefore, the first and second transfer gates 11 and 12 of each of the first to eighth shift switches SW0 to SW7 are turned on, and the third and fourth transfer gates 13 and 14 of each of the first to eighth shift switches SW0 to SW7 are turned off. As a result, the first to eighth input/output data line pairs DL0z, DL0x to DL7z, DL7x are connected to the first to eighth data bus line pairs DB0z, DB0x to DB7z, DB7x, respectively.

If the first data bus line pair DB0z, DB0x is defective and thus only the first detection signal S0 is high, the decoding circuit 23 outputs first to eighth switching signals J0 to J7 high. Therefore, the first and second transfer gates 11 and 12 of each of the first to eighth shift switches SW0 to SW7 are turned off, and the third and fourth transfer gates 13 and 14 of each of the first to eighth shift switches SW0 to SW7 are turned on. As a result, the first to eighth input/output data line pairs DL0z, DL0x to DL7z, DL7x are respectively connected to the second to eighth data bus line pairs DB1z, DB1x to DB7z, DB7x and to the redundancy data bus line pair DBsz, DBsx, each of which is one bit higher than the corresponding one of the first to eighth data bus line pairs DB0z, DB0x to DB7z, DB7x.

If the second data bus line pair DB1z, DB1x is defective and thus only the second detection signal S1 is high, the decoding circuit 23 outputs first switching signal J0 low, and second to eighth switching signals J1 to J7 high. Therefore, the first and second transfer gates 11 and 12 of the first shift switch SW0 are turned on, and the third and fourth transfer gates 13 and 14 of the first shift switch SW0 are turned off. Further, the first and second transfer gates 11 and 12 of each of the second to eighth shift switches SW1 to SW7 are turned off, and the third and fourth transfer gates 13 and 14 of each of the second to eighth shift switches SW1 to SW7 are turned on. As a result, the first input/output data line pair DL0z, DL0x is connected to the corresponding first data bus line pair DB0z, DB0x. Further, the second to eighth input/output data line pairs DL1z, DL1x to DL7z, DL7x are respectively connected to the third to eighth data bus line pairs DB2z, DB2x to DB7z, DB7x and to the redundancy data bus line pair DBsz, DBsx, each of which is one bit higher than the corresponding one of the second to eighth data bus line pairs DB1z, DB1x to DB7z, DB7x.

If the third data bus line pair DB2z, DB2x is defective and thus only the third detection signal S2 is high, the decoding circuit 23 outputs first and second switching signals J0 and J1 low, and third to eighth switching signals J2 to J7 high. Therefore, the first and second transfer gates 11 and 12 of each of the first and second shift switches SW0 and SW1 are turned on, and the third and fourth transfer gates 13 and 14 of each of the first and second shift switches SW0 and SW1 are turned off. Further, the first and second transfer gates 11 and 12 of each of the third to eighth shift switches SW2 to SW7 are turned off, and the third and fourth transfer gates 13 and 14 of each of the third to eighth shift switches SW2 to SW7 are turned on. As a result, the first and second input/output data line pairs DL0z, DL0x and DL1z, DL1x are connected to the corresponding first and second data bus line pairs DB0z, DB0x and DB1z, DB1x. Further, the third to eighth input/output data line pairs DL2z, DL2x to DL7z, DL7x are respectively connected to the fourth to eighth data bus line pairs DB3z, DB3x to DB7z, DB7x and to the redundancy data bus line pair DBsz, DBsx, each of which is one bit higher than the corresponding one of the third to eighth data bus line pairs DB2z, DB2x to DB7z, DB7x.

If the fourth data bus line pair DB3z, DB3x is defective and thus only the fourth detection signal S3 is high, the decoding circuit 23 outputs first to third switching signals J0 to J2 low, and fourth to eighth switching signals J3 to J7 high. Therefore, the first and second transfer gates 11 and 12 of each of the first to third shift switches SW0 to SW2 are turned on, and the third and fourth transfer gates 13 and 14 of each of the first to third shift switches SW0 to SW2 are turned off. Further, the first and second transfer gates 11 and 12 of each of the fourth to eighth shift switches SW3 to SW7 are turned off, and the third and fourth transfer gates 13 and 14 of each of the fourth to eighth shift switches SW3 to SW7 are turned on. As a result, the first to third input/output data line pairs DL0z, DL0x to DL2z, DL2x are connected to the corresponding first to third data bus line pairs DB0z, DB0x to DB2z, DB2x. Further, the fourth to eighth input/output data line pairs DL3z, DL3x to DL7z, DL7x are respectively connected to the fifth to eighth data bus line pairs DB4z, DB4x to DB7z, DB7x and to the redundancy data bus line pair DBsz, DBsx, each of which is one bit higher than the corresponding one of the fourth to eighth data bus line pairs DB3z, DB3x to DB7z, DB7x.

If the fifth data bus line pair DB4z, DB4x is defective and thus only the fifth detection signal S4 is high, the decoding circuit 23 outputs first to fourth switching signals J0 to J3 low, and fifth to eighth switching signals J4 to J7 high. Therefore, the first and second transfer gates 11 and 12 of each of the first to fourth shift switches SW0 to SW3 are turned on, and the third and fourth transfer gates 13 and 14 of each of the first to fourth shift switches SW0 to SW3 are turned off. Further, the first and second transfer gates 11 and 12 of each of the fifth to eighth shift switches SW4 to SW7 are turned off, and the third and fourth transfer gates 13 and 14 of each of the fifth to eighth shift switches SW4 to SW7 are turned on. As a result, the first to fourth input/output data line pairs DL0z, DL0x to DL3z, DL3x are connected to the corresponding first to fourth data bus line pairs DB0z, DB0x to DB3z, DB3x. Further, the fifth to eighth input/output data line pairs DL4z, DL4x to DL7z, DL7x are respectively connected to the sixth to eighth data bus line pairs DB5z, DB5x to DB7z, DB7x and to the redundancy data bus line pair DBsz, DBsx, each of which is one bit higher than the corresponding one of the fifth to eighth data bus line pairs DB4z, DB4x to DB7z, DB7x.

If there is a defect at the sixth data bus line pair DB5z, DB5x and thus only the sixth detection signal S5 is high, the decoding circuit 23 outputs first to fifth switching signals J0 to J4 low, and sixth to eighth switching signals J5 to J7 high. Therefore, the first and second transfer gates 11 and 12 of each of the first to fifth shift switches SW0 to SW4 are turned on, and the third and fourth transfer gates 13 and 14 of each of the first to fifth shift switches SW0 to SW4 are turned off. Further, the first and second transfer gates 11 and 12 of each of the sixth to eighth shift switches SW5 to SW7 are turned off, and the third and fourth transfer gates 13 and 14 of each of the sixth to eighth shift switches SW5 to SW7 are turned on. As a result, the first to fifth input/output data line pairs DL0z, DL0x to DL4z, DL4x are connected to the corresponding first to fifth data bus line pairs DB0z, DB0x to DB4z, DB4x. Further, the sixth to eighth input/output data line pairs DL5z, DL5x to DL7z, DL7x are respectively connected to the seventh and eighth data bus line pairs DB6z, DB6x and DB7z, DB7x and to the redundancy data bus line pair DBsz, DBsx, each of which is one bit higher than the corresponding one of the sixth to eighth data bus line pairs DB5z, DB5x to DB7z, DB7x.

If the seventh data bus line pair DB6z, DB6x is defective and thus only the seventh detection signal S6 is high, the decoding circuit 23 outputs first to sixth switching signals J0 to J5 low, and seventh and eighth switching signals J6 and J7 high. Therefore, the first and second transfer gates 11 and 12 of each of the first to sixth shift switches SW0 to SW5 are turned on, and the third and fourth transfer gates 13 and 14 of each of the first to sixth shift switches SW0 to SW5 are turned off. Further, the first and second transfer gates 11 and 12 of each of the seventh and eighth shift switches SW6 and SW7 are turned off, and the third and fourth transfer gates 13 and 14 of each of the seventh and eighth shift switches SW6 and SW7 are turned on. As a result, the first to sixth input/output data line pairs DL0z, DL0x to DL5z, DL5x are connected to the corresponding first to sixth data bus line pairs DB0z, DB0x to DB5z, DB5x. Further, the seventh and eighth input/output data line pairs DL6z, DL6x and DL7z, DL7x ate respectively connected to the eighth data bus line pair DB7z, DB7x and to the redundancy data bus line pair DBsz, DBsx, each of which is one bit higher than the corresponding one of the seventh and eighth data bus line pairs DB6z, DB6x and DB7z, DB7x.

Finally, if the eighth data bus line pair DB7z, DB7x is defective and thus only the eighth detection signal S7 is high, the decoding circuit 23 outputs first to seventh switching signals J0 to J6 low, and an eighth switching signal J7 high. Therefore, the first and second transfer gates 11 and 12 of each of the first to seventh shift switches SW0 to SW6 are turned on, and the third and fourth transfer gates 13 and 14 of each of the first to seventh shift switches SW0 to SW6 are turned off. Further, the first and second transfer gates 11 and 12 of the eighth shift switch SW7 are turned off, and the third and fourth transfer gates 13 and 14 of the eighth shift switch SW7 are turned on. As a result, the first to seventh input/output data line pairs DL0z, DL0x to DL6z, DL6x are connected to the corresponding first to seventh data bus line pairs DB0z, DB0x to DB6z, DB6x. Further, the eighth input/output data line pair DL7z, DL7x is connected to the redundancy data bus line pair DBsz, DBsx.

The first to eighth detection signals S0 to S7 of the detecting circuit 22 are provided to the gates of the NMOS transistors Q3 of the corresponding clamp circuits 16 as the first to eighth clamp control signals JK0 to JK7, respectively. That is, any defective one of the data bus line pairs DB0z DB0x to DB7z, DB7x is held at the ground voltage level in response to the turning on of the related NMOS transistors Q3.

Further, the ninth clamp control signal JK8 is generated by the detecting circuit 22. That is, when generating the first to eighth detection signals S0 to S7 low, the detecting circuit 22 applies the ninth clamp control signal JK8 high to the NMOS transistors Q3 of the clamp circuits 16 connected to the redundancy data bus line pair DBsz, DBsx. Therefore, if none of the first to eighth data bus line pairs DB0z, DB0x to DB7z, DB7x is defective, the redundancy data bus line pair DBsz, DBsx is held at the ground voltage in response to the turning on of the NMOS transistors Q3 of the corresponding clamp circuits 16.

Next, the advantages of the SDRAM 200 according to the first embodiment will be described below.

The first to eighth shift switches SW0 to SW7 are connected in the succeeding stage of the sense buffers SB0 to SB7 and the write amplifiers WA0 to WA7, respectively. That is, the first to eighth shift switches SW0 to SW7 are arranged at positions farther away from the bit line pairs BLz, Blx than the sense buffers SB0 to SB7 and the write amplifiers WA0 to WA7. Therefore, data having a very small amplitude read from the memory cells (not shown) is provided to the sense buffers SB0 to SB7 through the sense amplifiers (not shown) connected to the bit line pairs BLz, Blx and the data is not affected by the ON resistance and parasitic capacitance of the shift switches SW0 to SW7. As a result, the signals from the sense buffers SB0 to SB7 are easily and reliably inverted, thereby generating the read data with high accuracy.

Further, write data provided from the write amplifiers WA0 to WA7 to the sense amplifiers is not affected by the ON resistance and parasitic capacitance of the shift switches SW0 to SW7. As a result, such signals are easily and reliably inverted, thereby generating the write data with high accuracy.

External input/output terminals (not shown) are connected to the ends of the first to seventh input/output data line pairs DL0z, DL0x to DL6z, DL6x. The first to eighth shift switches SW0 to SW7 are arranged at positions closer to the external input/output terminals than the sense buffers SB0 to SB7 and the writ amplifiers WA0 to WA7. The read data is provided to the external input/output terminals while amplified by the sense buffers SB0 to SB7. At this time, the read data has a full amplitude, or amplitude which is larger than the very small amplitude with which it is provided to the sense buffers SB0 to SB7. Similarly, in the write operation, the write data from an external circuit has a full amplitude when it reaches the write amplifiers WA0 to WA7.

Therefore, since read data (write data) having a full amplitude passes through the first to eighth shift switches SW0 to SW7, it is not necessary to consider the ON resistance and parasitic capacitance, unlike the case where read data (write data) having a very small amplitude passes through the conventional shift switches. As a result, the size of the first to eighth shift switches SW0 to SW7 can be reduced, and hence their layout is easier. A reduction in the size of the first to eighth shift switches SW0 to SW7 leads to a reduction in current consumption.

Further, any defective one of the first to eighth data bus line pairs DB0z, DB0x to DB7z, DB7x is grounded, and when all of the first to eighth data bus line pairs DB0z, DB0x to DB7z, DB7x are normal, the redundancy data bus line pair DBsz, DBsx is grounded. Thus, the state in which the data bus line pairs DB0z, DB0x to DB7z, DB7x and DBsz, DBsx are floating is avoided. This in turn prevents the flowing of a through current caused by the operations of the sense buffer and the write amplifier, which are connected to any defective and unused one of the data bus line pairs DB0z, DB0x to DB7z, DB7x, and DBsz, DBsx.

Next, an SDRAM 300 having a data mask function according to a second embodiment of the present invention will be described with reference to FIGS. 5 and 6.

In the data mask function, the first to eighth data bus line pairs DB0z, DB0x to DB7z, DB7x are controlled and, the data bus line pairs are divided into two groups using first and second mask signals DQM0 and DQM1 provided from an external unit. For example, the first to fourth data bus line pairs DB0z, DB0x to DB3z, DB3x, which are the lower rank or least significant four bits, are controlled by the first mask signal DQM0, and the fifth to eighth data bus line pairs DB4z, DB4x to DB7z, DB7x, which are the upper rank or most significant four bits, are controlled by the second mask signal DQM1.

Specifically, when the first mask signal DQM0 is high, data is permitted to be written and read through the first to fourth data bus line pairs DB0z, DB0x to DB3z, DB3x. When the first mask signal DQM0 is low, data is prohibited from being written and read through the first to fourth data bus line pairs DB0z, DB0x to DB3z, DB3x.

Similarly, when the second mask signal DQM1 is high, data is permitted to be written and read through the fifth to eighth data bus line pairs DB4z, DB4x to DB7z, DB7x, and when the second mask signal DQM1 is low, data is prohibited from being written and read through the fifth to eighth data bus line pairs DB4z, DB4x to DB7z, DB7x.

Figure 5:
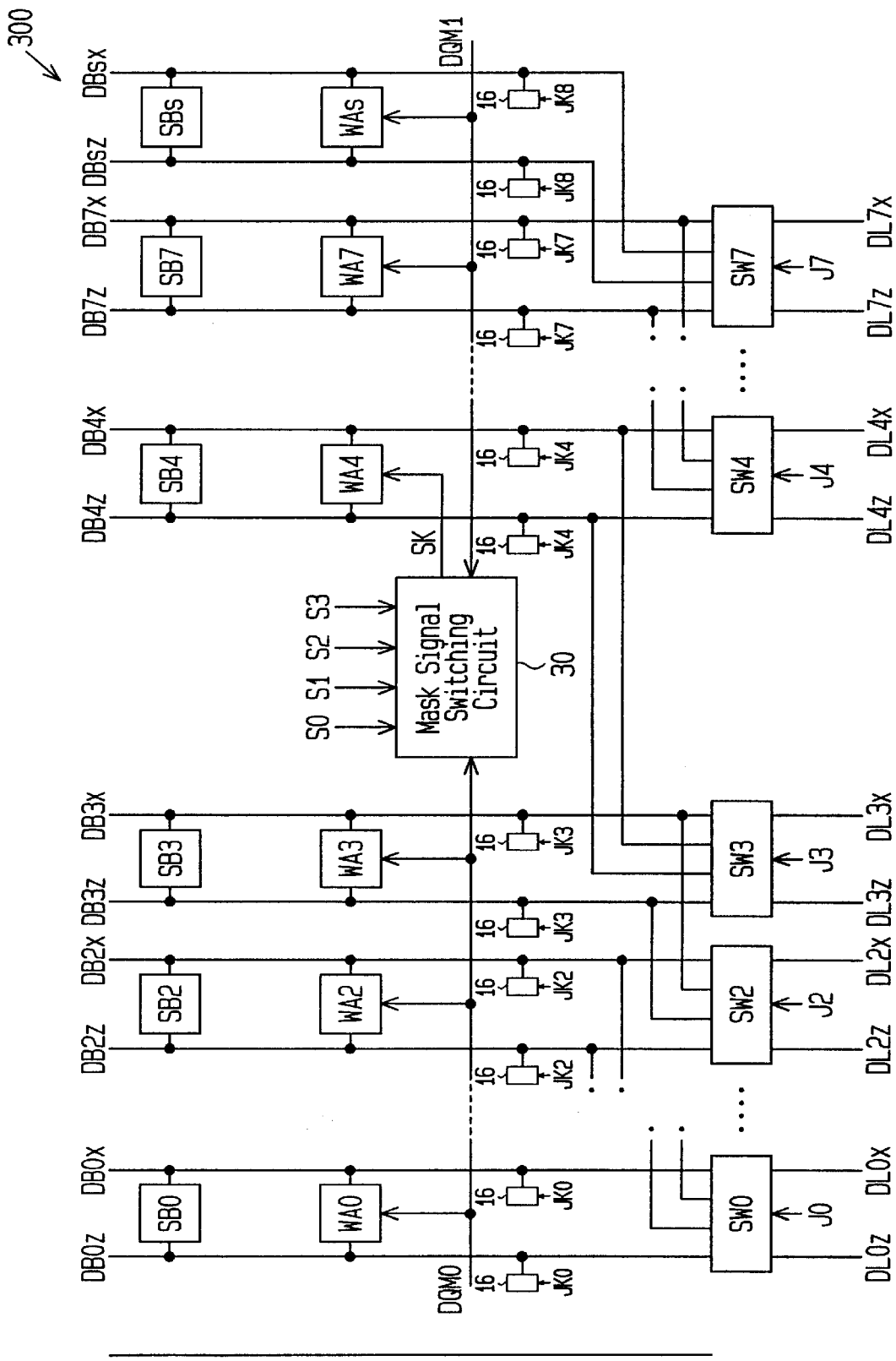
FIG. 5 is a schematic block diagram showing the main portion of an SDRAM according to a second embodiment of the present invention.

As shown in FIG. 5, the SDRAM 300 includes a mask signal switching circuit 30. The mask signal switching circuit 30 receives the first and second mask signals DQM0 and DQM1 from the external unit, selects one of the first and second mask signals DQM0 and DQM1, and provides the selected mask signal to the write amplifier WA4 of the fifth data bus line pair DB4z, DB4x as a switching mask signal SK.

The first mask signal DQM0 is provided to the write amplifiers WA0 to WA3 of the first to fourth data bus line pairs DB0z, DB0x to DB3z, DB3x. When the first mask signal DQM0 is high, the write amplifiers WA0 to WA3 are activated to amplify the write data. Further, when the first mask signal DQM0 is low, the write amplifiers WA0 to WA3 are notactivated to stop the write operation.

The second mask signal DQM1 is provided to the write amplifiers WA5 to WA7 of the sixth to eighth data bus line pairs DB5z, DB5x to DB7z, DB7x excluding the fifth data bus line pair DB4z, DB4x and to the write amplifier WAs of the redundancy data bus line pair DBsz, DBsx. When the second mask signal DQM1 is high, the write amplifiers WAS to WA7 and WAs are activated to amplify the write data. Further, when the second mask signal DQM1 is low, the write amplifiers WA5 to WA7 and WAs are notactivated to stop the write operation.

Specifically, when one of the first to fourth data bus line pairs DB0z, DB0x to DB3z, DB3x is defective, the mask signal switching circuit 30 provides the first mask signal DQM0 to the write amplifier WA4 as the switching mask signal SK. At this time, the fifth data bus line pair DB4z, DB4x belongs to the least significant four bit data bus line pairs DB0z, DB0x to DB3z, DB3x by the switching control of the shift switch SW3. Thus, the write amplifier WA4 connected to the fifth data bus line pair DB4z, DB4x is controlled by the first mask signal DQM0.

When one of the fifth to eighth data bus line pairs DB4z, DB4x to DB7z, DB7x is defective, the mask signal switching circuit 30 provides the second mask signal DQM1 to the write amplifier WA4 as the switching mask signal SK. At this time, the switching control of the shift switch SW3 is not effected, and the fifth data bus line pair DB4z, DB4x belongs to the most significant four bit data bus line pairs DB4z, DB4x to DB7z, DB7x. Thus, the write amplifier WA4 connected to the fifth data bus line pair DB4z, DB4x is controlled by the second mask signal DQM1.

Figure 6:
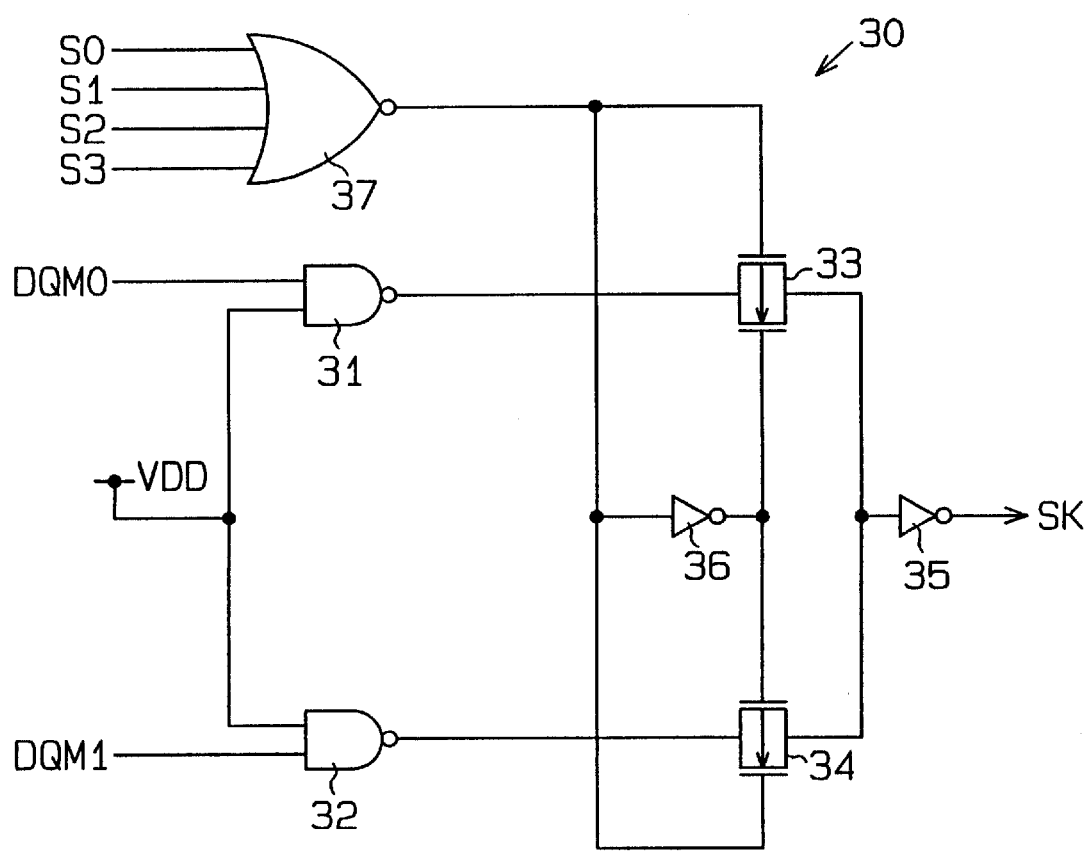
FIG. 6 is a schematic diagram showing a mask signal switching circuit of the SDRAM of FIG. 5.

As shown in FIG. 6, the mask signal switching circuit 30 includes first and second NAND circuits 31 and 32, first and second transfer gates 33 and 34, first and second inverter circuits 35 and 36, and a NOR circuit 37.

The first NAND circuit 31 has a first input terminal connected to a high-potential voltage power supply line (VDD), and a second input terminal for receiving the first mask signal DQM0. The output terminal of the first NAND circuit 31 is connected to the first inverter circuit 35 via the first transfer gate 33.

The first transfer gate 33 comprises a PMOS transistor and an NMOS transistor. An output signal of the NOR circuit 37 is applied to the gate of the PMOS transistor, and the output signal of the NOR circuit 37 is also applied to the gate of the NMOS transistor via the second inverter circuit 36. The NOR circuit 37 receives the first to fourth detection signals S0 to S3 from the detecting circuit 22 of FIG. 4.

When all of the first to fourth detection signals S0 to S3 are low (i.e., when at least the first to fourth data bus line pairs DB0z, DB0x to DB3z, DB3x are normal), the NOR circuit 37 outputs a high level signal. This signal turns the first transfer gate 33 off, thereby blocking a signal from the first NAND circuit 31.

When one of the first to fourth detection signals S0 to S3 is high (i.e., when one of the first to fourth data bus line pairs DB0z, DB0x to DB3z, DB3x is defective), the NOR circuit 37 outputs a low level signal, which turns the first transfer gate 33 on, thereby allowing a signal to be provided from the first NAND circuit 31 to the first inverter circuit 35. That is, the first mask signal DQM0 is provided to the write amplifier WA4 as the switching mask signal SK.

The second NAND circuit 32 has a first input terminal connected to the high-potential voltage power supply line (VDD), and a second input terminal for receiving the second mask signal DQM1. The output terminal of the second NAND circuit 32 is connected to the first inverter circuit 35 via the second transfer gate 34.

The second transfer gate 34 comprises a PMOS transistor and an NMOS transistor. An output signal of the NOR circuit 37 is applied to the gate of the PMOS transistor via the second inverter circuit 36, and the output signal of the NOR circuit 37 is also applied to the gate of the NMOS transistor of the second transfer gate 34.

The second transfer gate 34 is turned off when the first transfer gate 33 is turned on, and turned on when the first transfer gate 33 is turned off. More specifically, when at least the first to fourth data bus line pairs DB0z, DB0x to DB3z, DB3x are normal, the second transfer gate 34 is turned on, and thus the second mask signal DQM1 is provided to the write amplifier WA4 as the switching mask signal SK.

When one of the first to fourth data bus line pairs DB0z, DB0x to DB3z, DB3x is defective, the second transfer gate 34 is turned off, thereby blocking a signal from the second NAND circuit 32.

As described above, the SDRAM 300 according to the second embodiment provides the following advantages.

When a defect occurs at one of the first to eighth data bus line pairs DB0z, DB0x to DB7z, DB7x, the mask signal switching circuit 30 applies the mask signal DQM0 or DQM1 (switching mask signal SK) to the write amplifier WA4 in accordance with the defective one of the data bus line pairs DB0z, DB0x to DB7z, DB7x. Therefore, when the redundancy data bus line pair DBsz, DBsx is used, the data mask function is performed normally.

In the mask signal switching circuit 30, a high level write enable signal may be applied to the first input terminal of each of the NAND circuits 31 and 32 instead of connecting the high-potential voltage power supply line.

Next, an SDRAM 400 having a data mask function according to a third embodiment of the present invention will be described with reference to FIG. 7.

As shown in FIG. 7, the SDRAM 400 comprises a first redundancy data bus line pair DBsz1, DBsx1 and a second redundancy data bus line pair DBsz2, DBsx2. The first redundancy data bus line pair DBsz1, DBsx1 is provided for the first to fourth data bus line pairs DB0z, DB0x to DB3z, DB3x. The second redundancy data bus line pair DBsz2, DBsx2 is provided for the fifth to eighth data bus line pairs DB4z, DB4x to DB7z, DB7x. A sense buffer SBs and a write amplifier WAs are connected between the first redundancy data bus lines DBsz1 and DBsx1 and between the second redundancy data bus lines DBsz2 and DBsx2.

The fourth shift switch SW3 switches the connection between the fourth data bus line pair DB3z, DB3x and the first redundancy data bus line pair DBsz1, DBsx1. The eighth shift switch SW7 switches the connection between the eighth data bus line pair DB7z, DB7x and the second redundancy data bus line pair DBsz2, DBsx2.

When a defect occurs at one of the first to fourth data bus line pairs DB0z, DB0x to DB3z, DB3x, the first redundancy data bus line pair DBsz1, DBsx1 is used to compensate for the defect. When a defect occurs at one of the fifth to eighth data bus line pairs DB4z, DB4x to DB7z, DB7x, the second redundancy data bus line pair DBsz2, DBsx2 is used to compensate for the defect. Therefore, the first to fourth switching signals J0 to J3 corresponding to the first group of the first to fourth shift switches SW0 to SW3 are independent of the fifth to eighth switching signals J4 to J7 corresponding to the second group of the fifth to eighth shift switches SW4 to SW7. For example, when the second data bus line pair DB1z, DB1x has a defect, the second to fourth switching signals J1 to J3 are set to a high level, and the first, and fifth to eighth switching signals J0 and J4 to J7 are set to a low level. Thus, the redundant control signal generating circuit 20 of FIG. 2 generates the first to fourth switching signals J0 to J3 and the fifth to eighth switching signals J4 to J7, independently.

The first mask signal DQM0 is provided to the write amplifiers WA0 to WA3 and WAs of the first to fourth data bus line pairs DB0z, DB0x to DB3z, DB3x and the first redundancy data bus line pair DBsz1, DBsx1. The second mask signal DQM1 is provided to the write amplifiers WA5 to WA7 and WAs of the fifth to eighth data bus line pairs DB4z, DB4x to DB7z, DB7x and the second redundancy data bus line pair DBsz2, DBsx2.

As described above, in the SDRAM 400 according to the third embodiment, when a defect occurs at one of the first to fourth data bus line pairs DB0z, DB0x to DB3z, DB3x, the fourth input/output data line pair DL3z, DL3x is connected to the redundancy data bus line pair DBsz1, DBsx1 but not connected to the fifth data bus line pair DB4z, DB4x. As a result, when the switching operation is performed by the shift switches SW0 to SW7, the data mask function is performed reliably.

In the third embodiment, the clamp circuits 16 are omitted, however, the clamp circuits 16 may be used as in the first and second embodiments.

It should be apparent to those skilled in the art that the present invention may be embodied in many other specific forms without departing from the spirit or scope of the invention. Particularly, it should be understood that the invention may be embodied in the following forms.

The number of the data bus line pairs DB0z, DB0x to DB7z, DB7x is not limited to eight, but may be changed as desired, for example, to sixteen. The layout of the write amplifiers WA0 to WA7 and WAs and the sense buffers SB0 to SB7 and SBs may be changed. In this case, the shift switches SW0 to SW7 are arranged closer to the input/output data line pairs DL0z, DL0x to DL7z, DL7x than the write amplifiers WA0 to WA7 and the sense buffers SB0 to SB7.

In the second and third embodiments, the sense buffers SB0 to SB7 and SBs may also be controlled by the first and second mask signals DQM0 and DQM1 at the same time with the write amplifiers WA0 to WA7 and WAs.

The present invention may be embodied in a desired semiconductor memory device, such as an asynchronous DRAM and a static RAM.

The present examples and embodiments are to be considered as illustrative and not restrictive and the invention is not to be limited to the details given herein, but may be modified within the scope and equivalence of the appended claims.

What is claimed is:

1. A semiconductor memory device comprising:
   a plurality of input/output data line pairs;
   a plurality of data bus line pairs corresponding to the plurality of input/output data line pairs;
   a redundancy data bus line pair adjacent to one of the plurality of data bus line pairs;
   a plurality of sense buffers, each one connected between a corresponding one of the data bus line pairs and between the redundancy data bus line pair;
   a plurality of write amplifiers, each one connected between a corresponding one of the data bus line pairs and between the redundancy data bus line pair; and
   a plurality of redundancy shift switches, each one selectively connecting a corresponding one of the input/output data line pairs to a corresponding one of the data bus line pairs and to one data bus line pair, including the redundancy data bus line pair, adjacent to the corresponding data bus line pair, wherein the plurality of redundancy shift switches are arranged closer to the plurality of input/output data line pairs than the plurality of the sense buffers and the write amplifiers.

2. The semiconductor memory device according to claim 1, further comprising a plurality of clamp circuits, respectively connected to the plurality of data bus line pairs and the redundancy bus line pair, for clamping the data bus line pairs to a predetermined voltage.

3. The semiconductor memory device according to claim 2, further comprising a detecting circuit connected to the plurality of clamp circuits, wherein when a defect occurs at one of the plurality of data bus line pairs, the detecting circuit provides a detection signal to the clamp circuits corresponding to the defective data bus line pair.

4. The semiconductor memory device according to claim 3, further comprising a fuse circuit, connected to the detecting circuit, for providing to the detecting circuit a cut signal corresponding to the defective data bus line pair.

5. The semiconductor memory device according to claim 4, further comprising a decoding circuit, connected to the detecting circuit, for receiving the detection signal from the detecting circuit and providing switching signals to the redundancy shift switches, respectively.

6. A semiconductor memory device comprising:
   a plurality of input/output data line pair groups, including first and second input/output data line pair groups;
   a plurality of data bus line groups, including first and second data bus line pair groups corresponding to the first and second input/output data line pair groups, respectively;
   a redundancy data bus line pair adjacent to one of the plurality of data bus line groups;
   a plurality of sense buffer groups, including first and second sense buffer groups corresponding to the first and second data bus line pair groups, respectively, each of the first and second sense buffer groups including a plurality of sense buffers, each being connected between a corresponding one of the data bus line pairs;
   a redundancy sense buffer connected between the redundancy data bus line pair;
   a plurality of write amplifier groups, including first and second write amplifier groups corresponding to the first and second data bus line pair groups, respectively, each of the first and second write amplifier groups including a plurality of write amplifiers, each being connected between a corresponding one of the data bus line pairs, for receiving a mask signal;
   a redundancy write amplifier connected between the redundancy data bus line pair;
   a plurality of redundancy shift switch groups, including first and second redundancy shift switch groups connecting the first and second input/output data line pair groups to the first and second data bus line pair groups and the redundancy data bus line pair, wherein the first and second redundancy shift switch groups are provided closer to the input/output data line pairs than the sense buffers and the write amplifiers, each of the first and second redundancy shift switch groups including a plurality of redundancy shift switches, each being connected to a corresponding one of the data bus line pairs and one data bus line pair, including the redundancy data bus line pair, adjacent to the corresponding data bus line pair; and
   a mask signal switching circuit for receiving a mask signal and providing a switching signal to at least one of the write amplifier and the sense buffer corresponding to one data bus line pair of the second data bus line pair group which is connected to one redundancy shift switch of the first redundancy shift switch group.

7. The semiconductor memory device according to claim 6, wherein when a defect occurs at any data bus line pair of the first data bus line pair group, the first redundancy shift switch group connects one input/output data line pair of the first input/output data line pair group with one data bus line pair of the second data bus line pair group, and the mask signal switching circuit provides the mask signal for the first write amplifier group to the write amplifier corresponding to the one data bus line pair of the second data bus line pair group.

8. The semiconductor memory device according to claim 6, further comprising a plurality of clamp circuits, respectively connected to the plurality of data bus line pairs and the redundancy bus line pair, for clamping the data bus line pairs to a predetermined voltage.

9. The semiconductor memory device according to claim 8, further comprising a detecting circuit, wherein when a defect occurs at one of the plurality of data bus line pairs, the detecting circuit provides a detection signal to the clamp circuits corresponding to the defective data bus line pair.

10. The semiconductor memory device according to claim 9, further comprising a fuse circuit, connected to the detecting circuit, for providing to the detecting circuit a cut signal corresponding to the defective data bus line pair.

11. The semiconductor memory device according to claim 10, further comprising a decoding circuit, connected to the detecting circuit, for receiving detection signals from the detecting circuit and providing switching signals to the redundancy shift switches, respectively.

12. A semiconductor memory device comprising:
    a plurality of mask groups including first and second mask groups, each of the first and second mask groups including,
    a plurality of input/output data line pairs;
    a plurality of data bus line pairs corresponding to the plurality of input/output data line pairs;
    a redundancy data bus line pair adjacent to one of the plurality of data bus line pairs;
    a plurality of sense buffers, each one connected between a corresponding one of the data bus line pairs and between the redundancy data bus line pair;
    a plurality of write amplifiers, each one connected between a corresponding one of the data bus line pairs and between the redundancy data bus line pair, for receiving a mask signal; and
    a plurality of redundancy shift switches, each one connecting a corresponding one of the input/output data line pairs to a corresponding one of the data bus line pairs and to one data bus line pair or the redundancy data bus line pair, including the redundancy data bus line pair, adjacent to the corresponding data bus line pair, wherein the plurality of redundancy shift switches is arranged closer to the plurality of input/output data line pairs than the plurality of sense buffers and write amplifiers.

13. The semiconductor memory device according to claim 12, wherein the write amplifiers of the first mask group are controlled by a first mask signal, and the write amplifiers of the second mask group are controlled by a second mask signal.

* * * * *